United States Patent
Gondai

(10) Patent No.: US 7,569,154 B2
(45) Date of Patent: Aug. 4, 2009

(54) PLASMA PROCESSING METHOD, PLASMA PROCESSING APPARATUS AND COMPUTER STORAGE MEDIUM

(75) Inventor: Tadashi Gondai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 10/942,888

(22) Filed: Sep. 17, 2004

(65) Prior Publication Data
US 2005/0115676 A1    Jun. 2, 2005

Related U.S. Application Data

(63) Continuation-in-part of application No. PCT/JP03/02934, filed on Mar. 12, 2003.

(30) Foreign Application Priority Data
Mar. 19, 2002   (JP)   ............................ 2002-076039

(51) Int. Cl.
*C23F 1/00* (2006.01)

(52) U.S. Cl. ............................... 216/67; 216/68; 216/70

(58) Field of Classification Search .................. None
See application file for complete search history.

(56) References Cited

U.S. PATENT DOCUMENTS

| 2004/0076762 A1* | 4/2004 | Iijima ........................ 427/446 |
| 2005/0039773 A1* | 2/2005 | Moriya et al. ............... 134/1.2 |
| 2005/0051100 A1* | 3/2005 | Chiang et al. ............... 118/728 |

* cited by examiner

*Primary Examiner*—Allan Olsen
(74) *Attorney, Agent, or Firm*—Oblon, Spivak, McClelland, Maier & Neustadt, P.C.

(57) ABSTRACT

A plasma processing method in which plasma can be ignited stably with a low radio frequency power and a low gas pressure even after long time operation by applying a DC voltage of −0.5 kV, for example, from a DC power supply (118) to a lower electrode (104) before a radio frequency power is applied from a radio frequency power supply (114) to the lower electrode (104) through a matching unit 112 when the surface of a wafer W mounted on the lower electrode (104) disposed in a processing container (102) is subjected to a specified plasma processing with plasma of a processing gas formed by applying a radio frequency power to the processing gas introduced into the airtight processing container (102).

12 Claims, 6 Drawing Sheets

PLASMA PROCESSING METHOD, PLASMA PROCESSING APPARATUS AND COMPUTER STORAGE MEDIUM

This application is a continuation-in-part of and claims priority to International Application PCT/JP03/02934, filed Mar. 12, 2003, which claims priority to Japanese application JP 2002-76039, filed Mar. 19, 2002. The entire contents of these applications are incorporated herein by reference.

TECHNICAL FIELD

The present invention relates to a plasma processing method, a plasma processing apparatus and a computer storage medium. More particularly, the present invention relates to a plasma processing method that can generate plasma stably even in the case where the radio frequency power that is applied is low.

BACKGROUND ART

In a plasma process that is performed for the fabrication of a semiconductor device, or a liquid crystal display device, a processing gas is introduced into an airtight processing container having electrodes provided therein. Radio frequency power is then applied to the electrodes so as to change the processing gas to plasma. In this manner a predetermined process, such as etching of a surface of an object to be processed or deposition of a layer on the surface of the object, is performed.

However, with diversification of the fabrication process, the need may occur in some cases for performing the predetermined process under a condition in which the radio frequency power applied to the electrodes is low. Moreover, in the case where the plasma processing apparatus is continuously operated for a long time—for example, during fabrication of a product—foreign particles generated by the process may adhere to the inside of the plasma processing apparatus, thus preventing stable generation of plasma.

The present invention was made in view of the aforementioned problems of the conventional plasma processing method. Therefore, it is an object of the present invention to provide a novel and improved plasma processing method that can stably generate plasma, even in the case where the applied radio frequency power is low and even after plasma processing apparatus is operated for a long time.

DISCLOSURE OF THE INVENTION

In order to solve the aforementioned problems, according to the present invention, a method for performing a predetermined plasma process for a surface of an object to be processed by introducing a processing gas into an airtight processing container and applying a radio frequency power to generate plasma, comprises the steps of: applying a DC voltage to an electrode provided in the processing container, the object to be processed being placed on the electrode; and applying the radio frequency power to the electrode, to which the DC voltage has been applied, after the application of the DC voltage. Thus, in accordance with the present method, even when the applied radio frequency power is low, and even when a processing apparatus with foreign particles adhering thereto after long time operation is used, plasma can be stably generated.

The present invention is characterized in that the method further comprises the step of blocking the DC voltage during generation of the plasma after the application of the radio frequency power. According to this method, an effect of the DC voltage during the plasma process for the object to be processed can be suppressed to be minimum and a conventional processing condition can be applied without change.

The present invention is also characterized in that the DC voltage is −0.5 kV or lower with respect to the earth.

Furthermore, the present invention is characterized in that a pressure in the processing container is in a range from 10 mTorr to 20 mTorr and the radio frequency power is in a range from 50 W to 450 W.

The present invention is also characterized in that the pressure in the processing container is in a range from 10 mTorr to 25 mTorr and the radio frequency-power is in a range from 50 W to 200 W.

The present invention is characterized in that the pressure in the processing container is in a range from 10 mTorr to 30 mTorr and the radio frequency power is in a range from 50 W to 150 W.

In the aforementioned ranges, it is hard to ignite plasma when no DC voltage is applied. However, by application of the DC voltage, plasma can be ignited stably.

Moreover, according to the present invention, a method for performing a predetermined plasma process for a surface of an object to be processed by introducing a processing gas into an airtight processing container and applying a radio frequency power to generate plasma, comprises the steps of: applying a DC voltage to a first electrode provided in the processing container, the object to be processed being placed on the first electrode; applying the radio frequency power for plasma generation to a second electrode that is different from the first electrode after the DC voltage has been applied to the first electrode; and applying a bias radio frequency power to the first electrode after the radio frequency power for plasma generation has been applied to the second electrode.

Moreover, according to the present invention, a method for performing a predetermined plasma process for a surface of an object to be processed by introducing a processing gas into an airtight processing container and applying a radio frequency power to generate plasma, comprises steps of: applying a DC voltage to a first electrode provided in the processing container, the object to be processed being placed on the first electrode; applying a bias radio frequency power to the first electrode after the DC voltage has been applied to the first electrode; and applying the radio frequency power for plasma generation to a second electrode that is different from the first electrode after the bias radio frequency power has been applied to the first electrode.

Moreover, according to the present invention, a method for performing a predetermined plasma process for a surface of an object to be processed by introducing a processing gas into an airtight processing container and applying a radio frequency power to an antenna to generate plasma, comprises the steps of: applying a DC voltage to an electrode provided in the processing container, the object to be processed being placed on the electrode; applying the radio frequency power for plasma generation to the antenna after the DC voltage has been applied to the electrode; and applying a bias radio frequency power to the electrode after the radio frequency power for plasma generation has been applied to the antenna.

Furthermore, the present invention is characterized in that the application of the DC voltage is stopped during the generation of the plasma.

Moreover, according to the present invention, a plasma processing apparatus comprising: an airtight processing container; an electrode provided in the processing container, the electrode placing an object to be processed thereon; a radio frequency power supply for supplying a radio frequency

power to the electrode; a DC power supply for supplying a DC voltage to the electrode; and a controller for supplying the radio frequency power to the electrode after supplying the DC voltage to the electrode.

Moreover, according to the present invention, a plasma processing apparatus comprising: an airtight processing container; an first electrode provided in the processing container, the first electrode placing an object to be processed thereon; a second electrode provided in the processing container; a first radio frequency power supply for supplying a first radio frequency power to the first electrode; a second radio frequency power supply for supplying a second radio frequency power to the second electrode; a DC power supply for supplying a DC voltage to the first electrode; and a controller for supplying the DC voltage to the first electrode, supplying the second radio frequency power to the second electrode, and supplying the first radio frequency power to the first electrode, in sequence.

Moreover, according to the present invention, a plasma processing apparatus comprising: an airtight processing container; an first electrode provided in the processing container, the first electrode placing an object to be processed thereon; a second electrode provided in the processing container; a first radio frequency power supply for supplying a first radio frequency power to the first electrode; a second radio frequency power supply for supplying a second radio frequency power to the second electrode; a DC power supply for supplying a DC voltage to the first electrode; and a controller for supplying the DC voltage to the first electrode, supplying the first radio frequency power to the first electrode, and supplying the second radio frequency power to the second electrode, in sequence.

Moreover, according to the present invention, a plasma processing apparatus comprising: an airtight processing container; an electrode provided in the processing container, the first electrode placing an object to be processed thereon; an antenna provided in the processing container; a first radio frequency power supply for supplying a first radio frequency power to the electrode; a second radio frequency power supply for supplying a second radio frequency power to the antenna; a DC power supply for supplying a DC voltage to the electrode; and a controller for supplying the DC voltage to the first electrode, supplying the second radio frequency power to the antenna, and supplying the first radio frequency power to the electrode, in sequence.

Furthermore, according to the present invention, a computer storage medium stores therein a program for controlling the plasma processing method of the present invention.

BEST MODE FOR CARRYING OUT THE INVENTION

Preferred embodiments of a plasma processing method according to the present invention are now described in detail, with reference to the accompanying drawings. In the following description the plasma etching apparatus 100 shown in FIG. 1 is described as an example.

Figure 1:
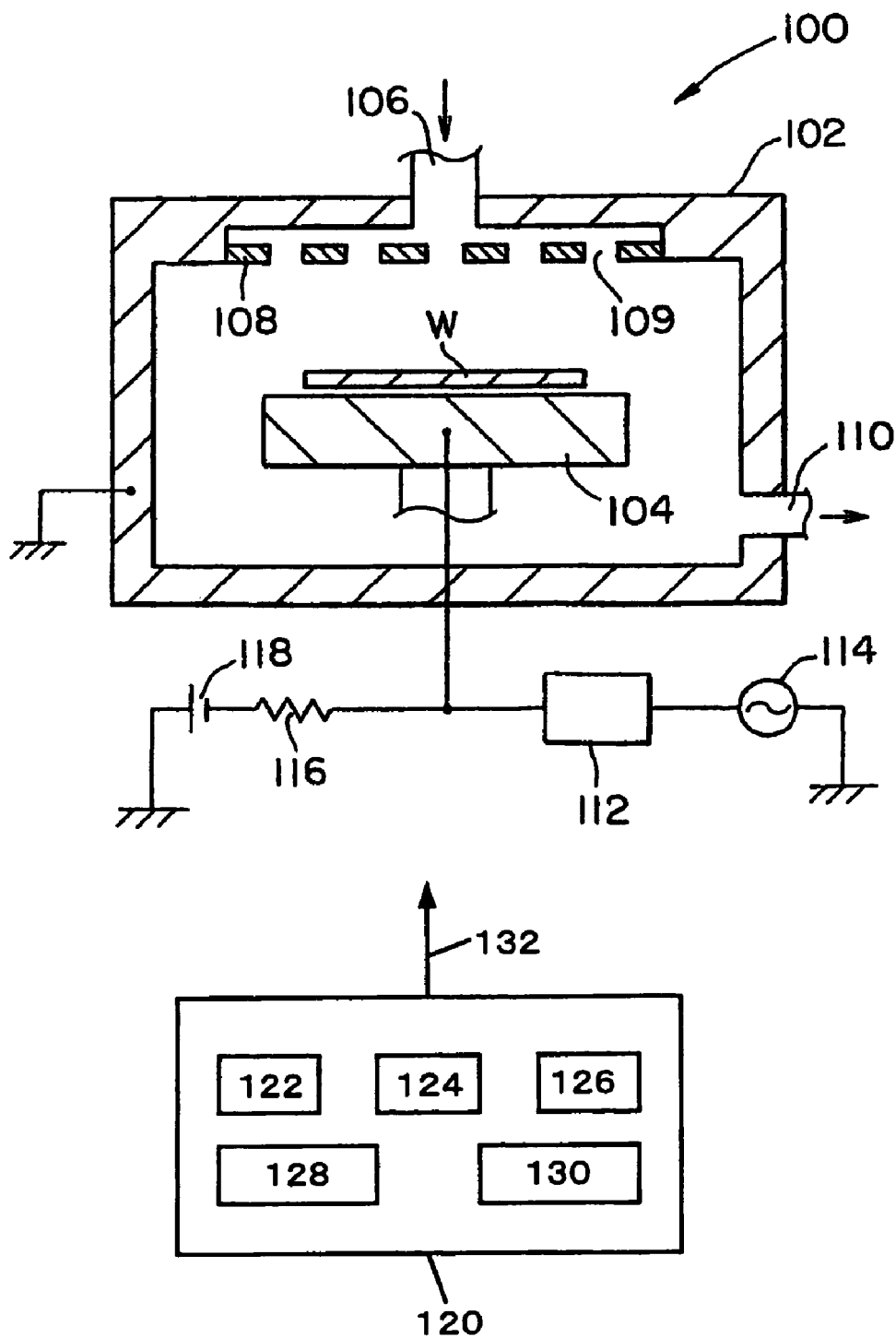
FIG. 1 shows a cross-sectional view of a plasma etching apparatus according to an embodiment of the present invention.

As shown in FIG. 1, by way of example, the plasma etching apparatus 100 includes an airtight processing container 102 that is approximately cylindrical and is grounded. In the processing container 102 a lower electrode 104 is provided, also serving as a placing table which is movable up and down, on which a semiconductor wafer W is placed.

The lower electrode 104 is kept at a predetermined temperature by a temperature adjustment mechanism (not shown) formed by a heater, a temperature measurement member or the like, which are embedded therein. A heat transfer gas supplying mechanism (not shown) is provided between the semiconductor wafer W and the lower electrode 104, and supplies heat transfer gas (for example, He gas) with a predetermined pressure so as to transfer heat from the lower electrode 104 to the semiconductor wafer W. In this manner, the temperature of the semiconductor wafer W can be controlled.

An upper electrode 108 is provided, opposed to the lower electrode 104, and is grounded via the processing container 102. In the present embodiment, a radio frequency power is applied only to the lower electrode 104. However, the plasma etching apparatus 100 may be arranged in such a manner that the radio frequency power is also applied to the upper electrode 108.

In an upper part of the processing container 102, a gas inlet 106 connected to a gas introduction system (not shown) is provided. The processing gas is introduced into the processing container 102 via a plurality of gas outlets 109 provided in the upper electrode 108. As the processing gas, for example, a mixed gas of $C_4F_8$, CO, Ar, and $O_2$ is used.

In a lower part of the processing container 102, an exhaust tube 110 is provided that is connected to an exhaust system (not shown). Due to the ability to exhaust through the exhaust tube 110, the pressure in the processing container 102 is maintained at a predetermined pressure. Magnets may be provided on outer surfaces of both sidewalls of the processing container 102 so as to apply a magnetic field that is perpendicular to an electric field. In this case, it is preferable that the magnets be arranged in such a manner that the intensity of the magnetic field can be varied.

To the lower electrode 104 is connected a radio frequency power supply 114 via a matching unit 112. Also, a DC power supply 118, that is a feature of the present invention, is connected to the lower electrode 104 via a resistor 116 that functions as a filter for blocking a radio frequency power from the radio frequency power supply 114. The frequency of the radio frequency power supply 114 is preferably in the range from 10 MHz to 200 MHz, and is set to 13.56 MHz, for example. The DC power supply 118 is arranged to provide a negative potential—for example, a potential of −0.5 kV—to the lower electrode 104. A choke coil may be provided between the DC power supply 118 and the radio frequency power supply 114 so as to assist in the blocking of the radio frequency power.

The radio frequency power supply 114, and the DC power supply 118, supply power so as to change the processing gas, introduced into the processing container 102, into plasma. Thus, an object to be processed is etched by the energy of ions accelerated by a self-bias voltage generated in the vicinity of the lower electrode 104 between the electrodes, and by the energy of radicals.

The plasma etching apparatus 100 further comprising includes a controller 120. The controller 120 preferably controls processes carried out by the apparatus 100 in a completely automated manner by way of controlling, e.g., the radio frequency power supply 114, the matching unit 112 and the DC power supply 118. The controller 120 can be implemented by a general purpose computer, e.g., PC, which has a CPU 122, a mother board 124, a hard disk 126, memories 128 such as RAM and ROM, and a CD/DVD drive 130. The process control can be carried out under the control of a control program or a software running on the controller 120. Though not specifically depicted in FIG. 1, control signals 132 are provided from the controller 120 to the aforementioned electrical and mechanical components via controller lines (not shown). The control program can be programmed on the controller 120 or can be provided thereto from outside via, e.g., a network or the CD/DVD drive 130 and then stored in, e.g., the hard disk 126 for the execution thereof.

Next, an etching operation performed with the plasma etching apparatus 100 is described. First, a semiconductor wafer W is placed on the lower electrode 104 in the processing container 102, and the air in the processing container 102 is exhausted by the exhaust system (not shown) through the exhaust tube 110. Then, a predetermined processing gas is introduced into the processing container 102 from the gas inlet 106 through the gas outlets 109 at a predetermined flow rate so as to adjust the pressure inside the processing container 102 to a predetermined pressure.

Subsequently, a DC voltage of −0.5 kV, for example, is applied to the lower electrode 104 by the DC power supply 118. Thereafter a radio frequency power having a frequency of 13.56 MHz, for example, is applied by the radio frequency power supply 114. The power applied by the radio frequency power 114 is described later. The application of the DC power and the radio frequency power changes the processing gas in the processing container 102 into plasma, and thereby a surface of an object to be processed is etched in a predetermined manner. The aforementioned etching operation is controlled by the controller 120 in a fully automated manner.

Next, the effects of the DC power supply 118 that is a feature of the present invention are described. While using a mixed gas of CO, $O_2$, and $N_2$ as the processing gas, a series of trials with varying radio frequency powers and differing gas pressure within the processing container were performed by the plasma etching apparatus 100. The results of the generation of plasma under those various conditions are shown in Table 1.

In these trials, five semiconductor wafers were successively processed. In Table 1, cases where plasma was ignited stably for all the five semiconductor wafers are shown with a circle; cases where it was hard to ignite plasma for one of the five semiconductor wafers are shown with a triangle; and cases where plasma was not ignited for all the five semiconductor wafers are shown with a cross.

TABLE 1

| RF Power (W) | Pressure (mTorr) | | | | | | | |
|---|---|---|---|---|---|---|---|---|
| | 15 | 20 | 25 | 30 | 35 | 40 | 45 | 50 |
| 100 | X | X | X | X | X | X | X | ○ |
| 150 | X | X | X | X | ○ | ○ | ○ | |
| 200 | X | X | X | ○ | | | | |
| 250 | X | X | Δ | | | | | |
| 300 | X | X | ○ | | | | | |
| 350 | X | X | | | | | | |
| 400 | X | X | | | | | | |
| 450 | X | X | | | | | | |
| 500 | X | ○ | | | | | | |

As shown in Table 1, as the pressure in the processing container becomes lower, or the radio frequency power becomes lower, it is harder to ignite plasma. For example, in the case where a pressure is 20 mTorr, plasma is not ignited until the radio frequency power applied reaches approximately 500 W. In the case where a pressure is 50 mTorr, plasma can be ignited when a radio frequency power of 100 W is applied. In Table 1, trial conditions for which no result is recorded (as a blank) indicates that those conditions were not tested. However, from the tendencies described above, it is determined that plasma can be ignited stably under those conditions shown with a blank.

On the other hand, when a DC voltage of −0.5 kV was applied to the lower electrode 104 before the application of the radio frequency power, it was shown that plasma was ignited for all the five semiconductor wafers even in the case where the pressure in the processing container 102 was 10 mTorr and the radio frequency power was 50 W. Moreover, in the case where the applied DC power was −0.4 kV or lower, plasma was not ignited for all the five semiconductor wafers when the pressure in the processing container 102 was 10 mTorr and the radio frequency power was 50 W.

After plasma was ignited, the plasma was generated stably even when the power supply from the DC power supply 118 was blocked. Please note that it was checked that plasma was ignited by adjusting the capacitance of a capacitor (not shown) in the matching unit 112 and checking the existence of a matching state where no reflected wave exists. Moreover, in a case of using a mixed gas of $C_4F_8$, CO, Ar, and $O_2$ as the processing gas, the capacitance value of the capacitor in the matching unit 112, while matching is achieved, does not change significantly by the application of the DC voltage. Thus, the effect of the application of the DC voltage on a plasma state can be ignored. Therefore, a plasma process for an object to be processed can be performed in a similar manner to that in the case where no DC voltage is applied.

As described above, in the event that the processing gas is introduced into the airtight processing container 102, and is changed to plasma by application of a power by the radio frequency power supply 114 so as to perform a predetermined process for a surface of an object to be processed, when a DC voltage of −0.5 kV is applied by the DC power supply 118 for the pressure in the processing container 102 of 10 mTorr and the power of the radio frequency power supply 114 of 50 W, the radio frequency power is applied to the lower electrode 104 in the state where the processing gas is excited energetically. Thus, even in the case where the radio frequency power applied is as low as 50 W, it is easy to ignite plasma. After the plasma is stabilized, the DC power supply may be blocked. Therefore, the effect of the application of DC power on the plasma process for an object to be processed can be suppressed to be minimum.

Moreover, since plasma can be ignited easily for the lower radio frequency power and the lower pressure of processing gas as described above, a plasma processing method that can accommodate processes with various conditions can be provided. In addition, since plasma can be ignited even if foreign particles adhere to the processing apparatus after long time use of the processing apparatus, maintenance becomes easier.

The aforementioned sequence of supplying the DC voltage and the radio frequency power may be preferably controlled by the controller 120 in a fully automated manner as described above in connection with the plasma etching apparatus 100.

Figure 2:
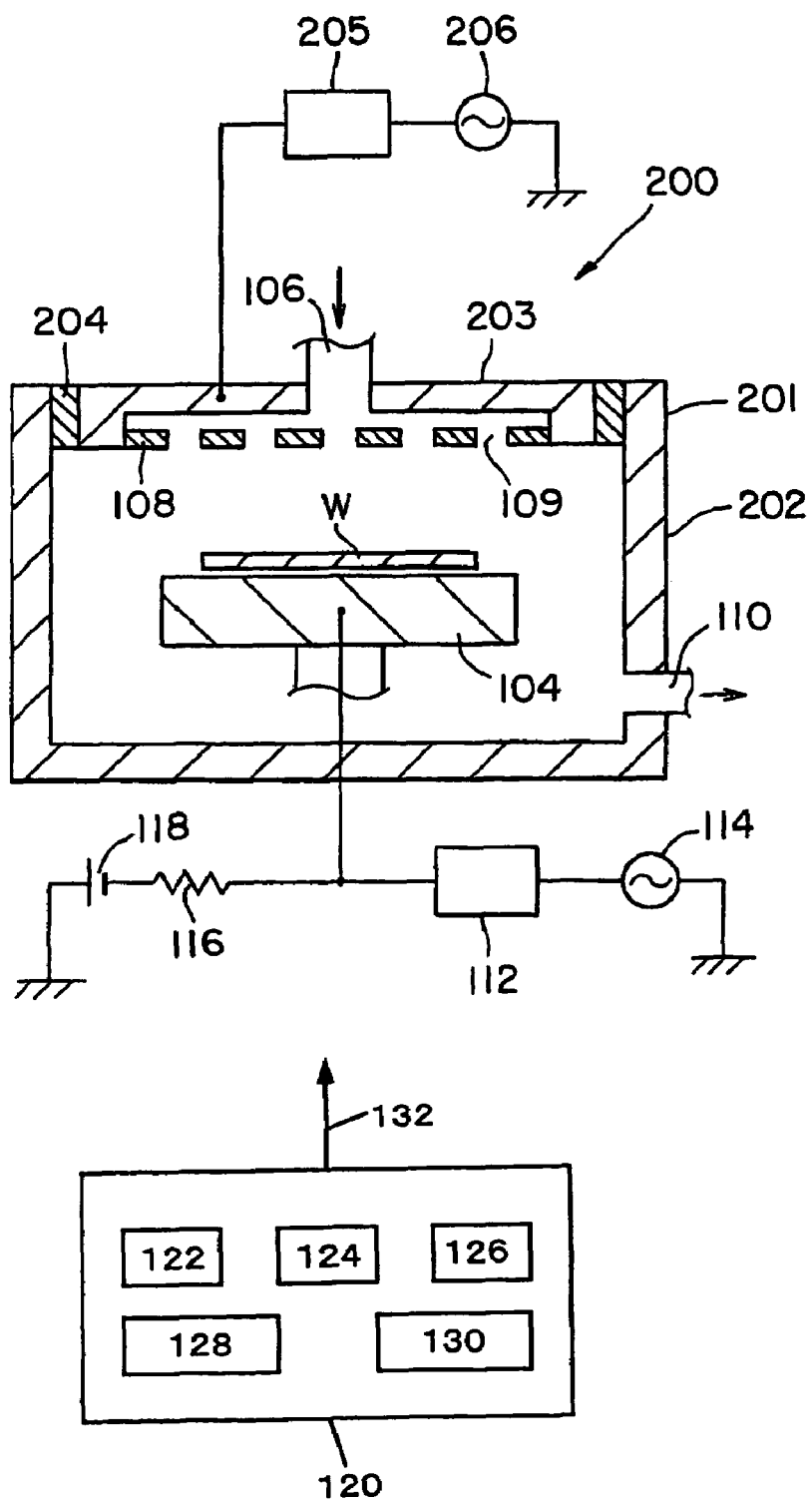
FIG. 2 shows a cross-sectional view of a plasma etching apparatus according to another embodiment of the present invention.
Figure 3:
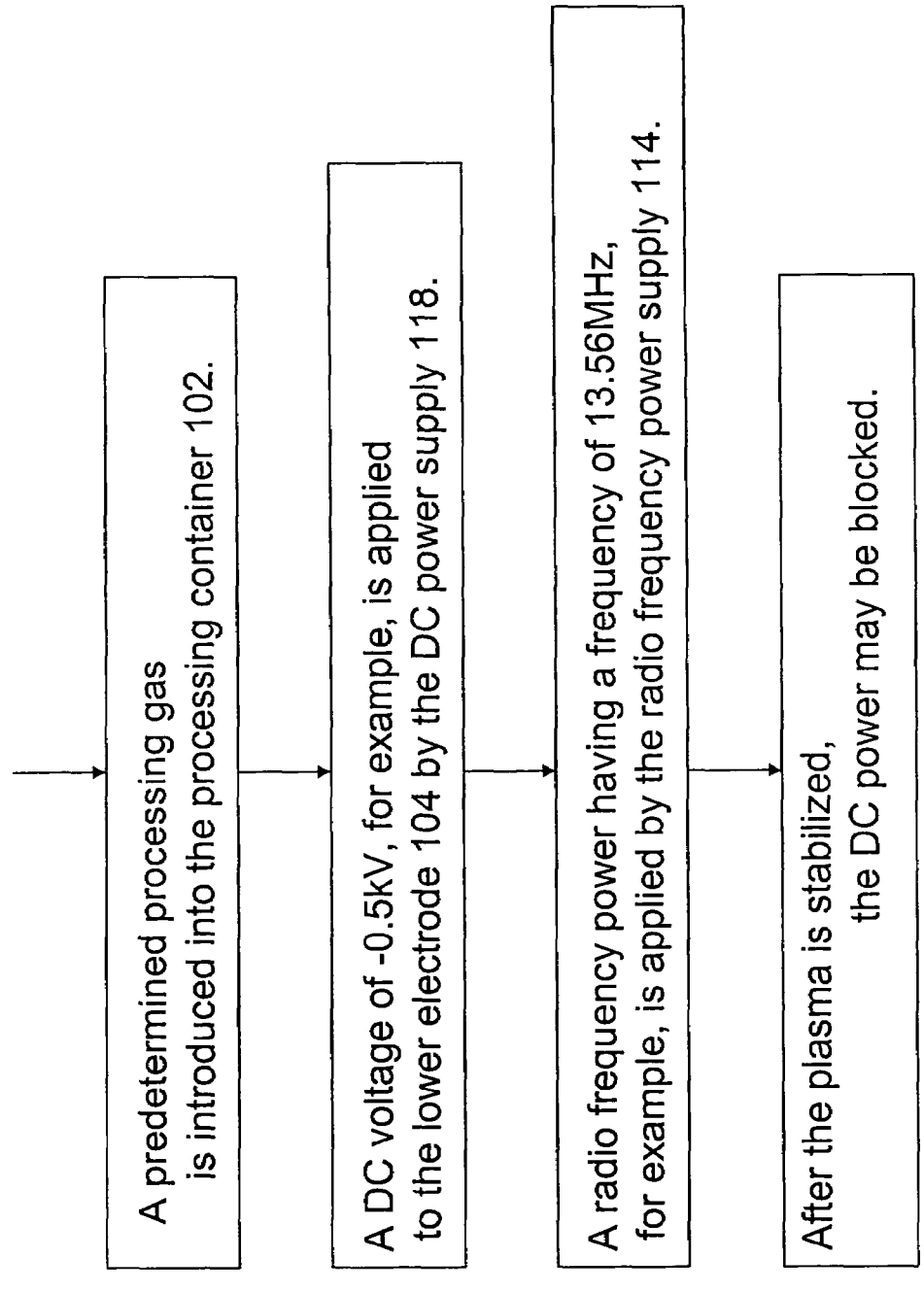
FIG. 3 shows a plasma processing method in accordance with one example embodiment.
Figure 4:
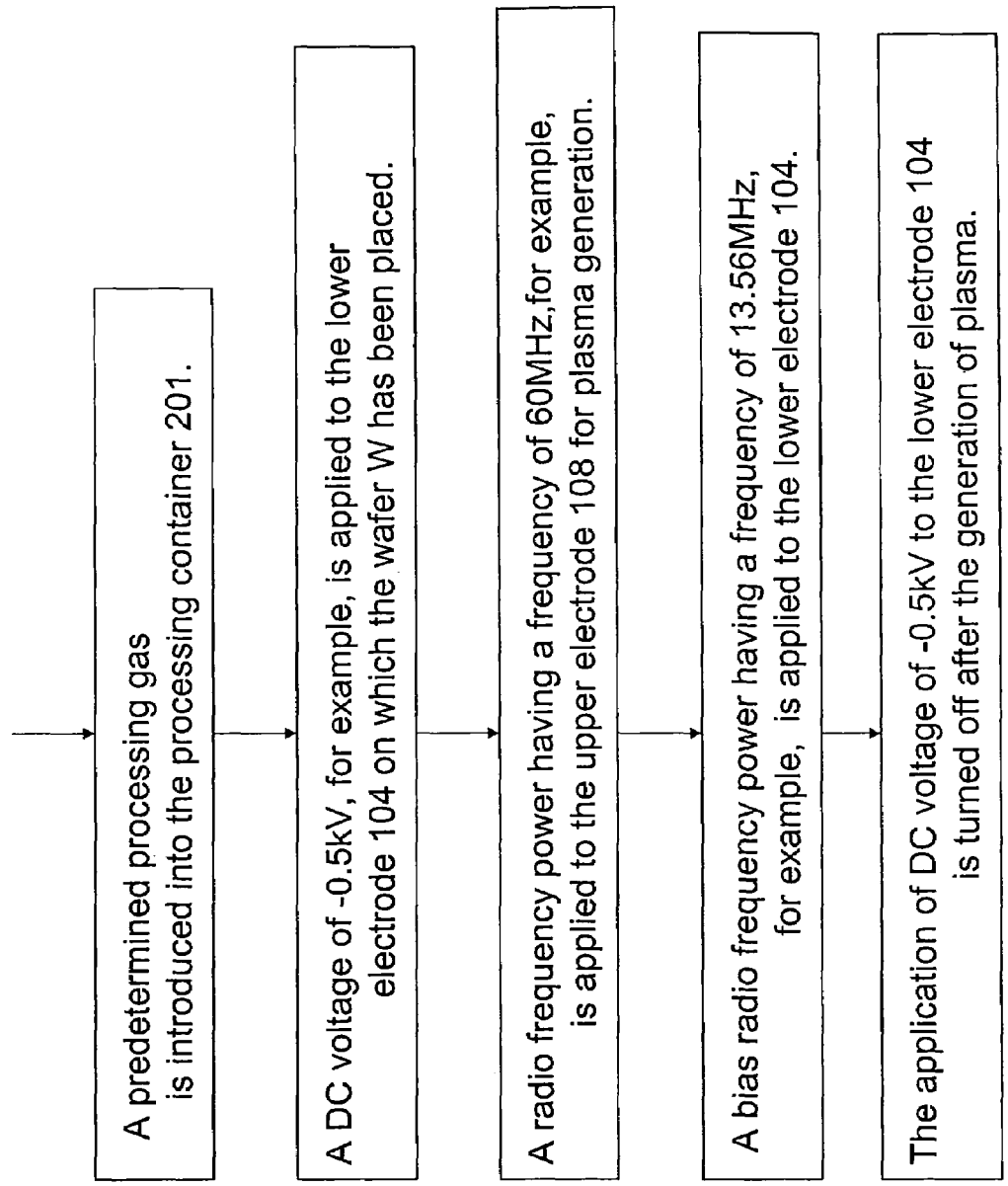
FIG. 4 shows a plasma processing method in accordance with another example embodiment.
Figure 5:
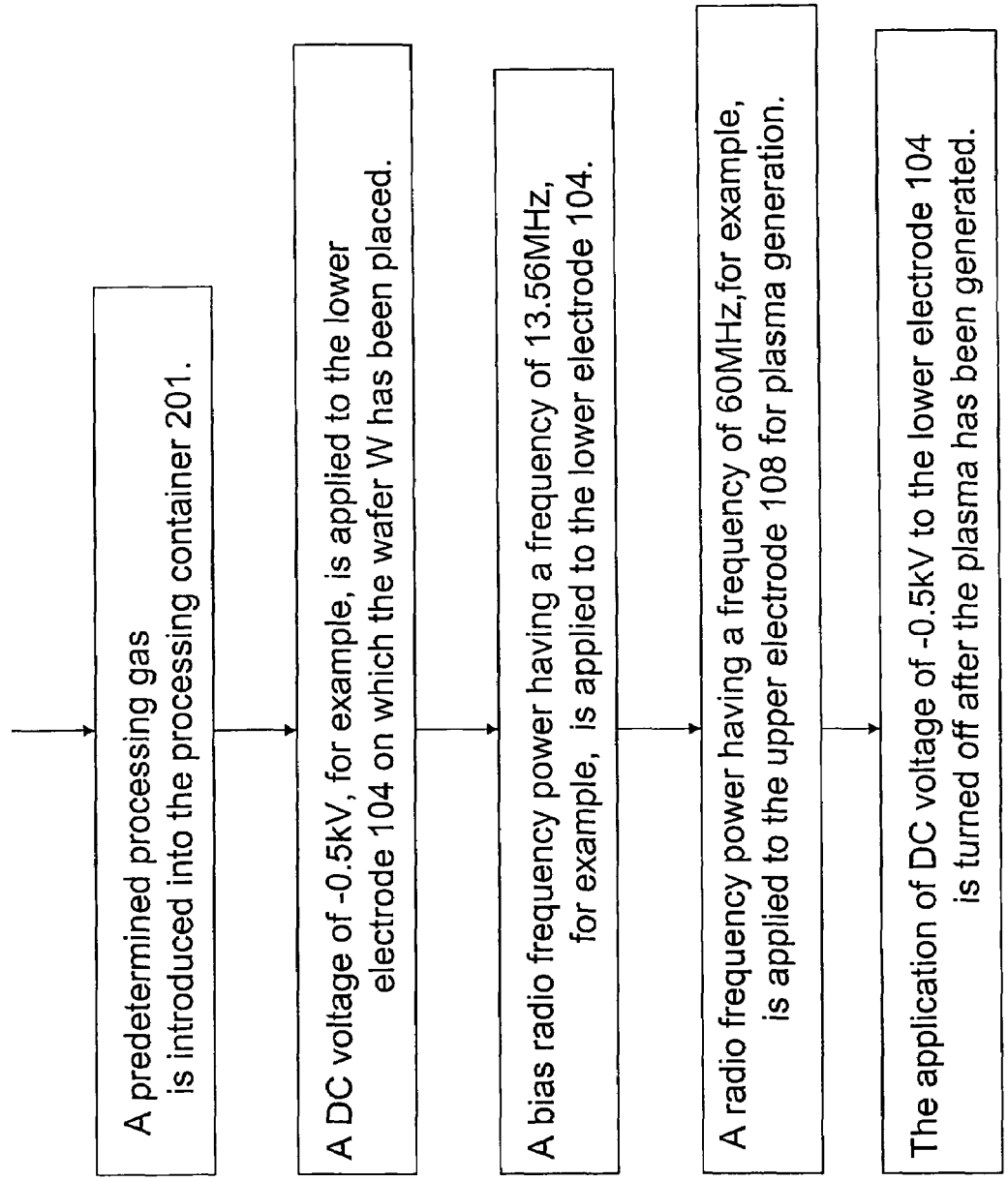
FIG. 5 shows a plasma processing method in accordance with yet another example embodiment.
Figure 6:
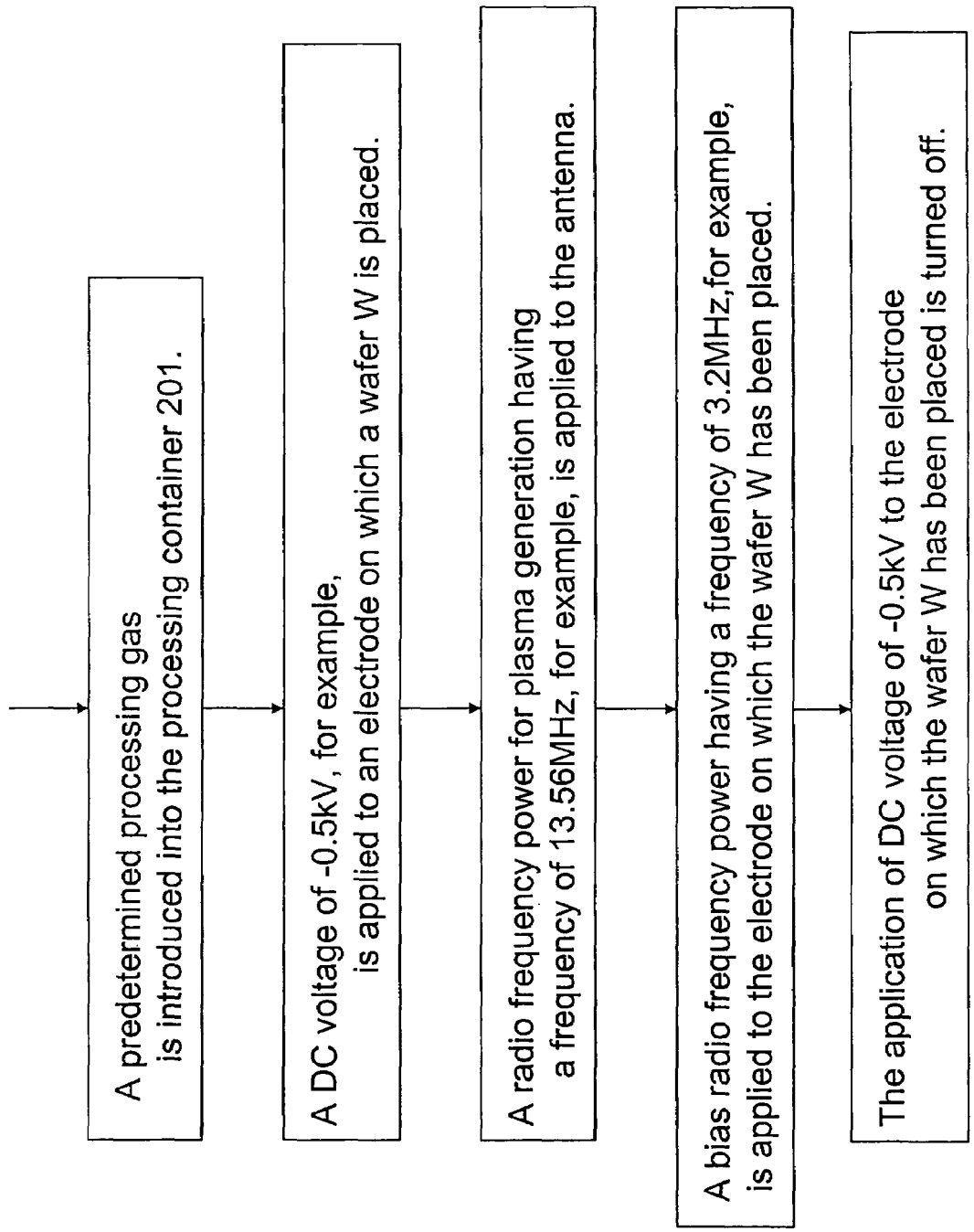
FIG. 6 shows a shows a plasma processing method in accordance with still another example embodiment.

Next, FIG. 2 shows a cross-sectional view of a plasma etching apparatus 200 according to another embodiment of the present invention. In the plasma etching apparatus 200, the same components having substantially the same functions and structures as those in the plasma etching apparatus 100 shown in FIG. 1 are labeled with the same reference numerals and therefore the description thereof is omitted.

The plasma etching apparatus 200 includes a processing container 201 provided with a container body 202 that is cylindrical and has a bottom. The processing container 201 is grounded for safety. In the top opening of the container body 202, a top board 203 is mounted in an airtight manner via an insulation member 204. The top board 203 is provided with an upper electrode 108 as the second electrode, as in the plasma etching apparatus 100 shown in FIG. 1. The top board 203 is connected to a radio frequency power supply 206 via a matching unit 205.

In order to perform an etching process in the plasma etching apparatus 200, a wafer W is placed on a lower electrode as the first electrode, as in the plasma etching apparatus 100 shown in FIG. 1.

Then, a predetermined processing gas is introduced into the processing container 201 and is adjusted to achieve a predetermined pressure.

Thereafter, a DC voltage of −0.5 kV, for example, is applied to the lower electrode 104 on which the wafer W has been placed.

Subsequently, a radio frequency power having a frequency of 60 MHz, for example, is applied to the upper electrode 108 for plasma generation.

Thereafter, a bias radio frequency power having a frequency of 13.56 MHz, for example, is applied to the lower electrode 104.

Then, the application of DC voltage of −0.5 kV to the lower electrode 104 is turned off after the generation of plasma.

The aforementioned sequence may be preferably controlled by the controller 120 in a fully automated manner.

Plasma may also be ignited in the following manner, instead of the above-described manner. First, a DC voltage of −0.5 kV, for example, is applied to the lower electrode 104 on which the wafer W has been placed.

Subsequently, a bias radio frequency power having a frequency of 13.56 MHz, for example, is applied to the lower electrode 104.

Thereafter, a radio frequency power having a frequency of 60 MHz, for example, is applied to the upper electrode 108 for plasma generation.

Then, the application of DC voltage of −0.5 kV to the lower electrode 104 is turned off after the plasma has been generated.

The aforementioned sequence may be preferably controlled by the controller 120 in a fully automated manner.

Moreover, the present invention can be applied to the case of using an inductively-coupled plasma apparatus in which an antenna is provided in place of the upper electrode 108.

In this case, a DC voltage of −0.5 kV, for example, is applied to an electrode on which a wafer W is placed; a radio frequency power for plasma generation having a frequency of 13.56 MHz, for example, is then applied to the antenna; and a bias radio frequency power having a frequency of 3.2 MHz, for example, is then applied to the electrode on which the wafer W has been placed. Then, after plasma has been generated, the application of the DC voltage of −0.5 kV to the electrode on which the wafer W has been placed is turned off.

The aforementioned sequence may be preferably controlled by the controller 120 in a fully automated manner.

As described above, according to the present invention, a plasma processing method can be provided that can stably generate plasma even in the case where the applied radio frequency power is low, and even after long-time operation of the plasma processing apparatus.

The invention claimed is:

1. A method for performing a predetermined plasma process for a surface of an object to be processed by introducing a processing gas into an airtight processing container and applying a radio frequency power to generate plasma, the method comprising the steps of:
   introducing a predetermined processing gas into the processing container;
   applying a negative DC voltage to an electrode provided in the processing container, the object to be processed being placed on the electrode, after the introducing a predetermined processing gas;
   applying the radio frequency power to the electrode to which the negative DC voltage has been applied, after the application of the negative DC voltage; and
   stopping the application of the negative DC voltage during generation of the plasma after the application of the radio frequency power.

2. The method for performing a plasma process according to claim 1, wherein the DC voltage is −0.5 kV or lower.

3. The method for performing a plasma process according to claim 1, wherein a pressure in the processing container is in a range from 10 mTorr to 20 mTorr and the radio frequency power is in a range from 50 W to 450 W.

4. The method for performing a plasma process according to claim 1, wherein the pressure in the processing container is in a range from 10 mTorr to 25 mTorr and the radio frequency power is in a range from 50 W to 200 W.

5. The method for performing a plasma process according to claim 1, wherein the pressure in the processing container is in a range from 10 mTorr to 30 mTorr and the radio frequency power is in a range from 50 W to 150 W.

6. A computer storage medium storing therein a program for controlling the plasma processing method of claim 1.

7. A method for performing a predetermined plasma process for a surface of an object to be processed by introducing a processing gas into an airtight processing container and applying a radio frequency power to generate plasma the method comprising the steps of:
   introducing a predetermined processing gas into the processing container;
   applying a negative DC voltage to a first electrode provided in the processing container, the object to be processed being placed on the first electrode, after the introducing a predetermined processing gas;
   applying the radio frequency power for plasma generation to a second electrode that is different from the first electrode after the negative DC voltage has been applied to the first electrode;

applying a bias radio frequency power to the first electrode after the radio frequency power for plasma generation has been applied to the second electrode; and stopping the application of the negative DC voltage after the application of the bias radio frequency power.

8. A computer storage medium storing therein a program for controlling the plasma processing method of claim 7.

9. A method for performing a predetermined plasma process for a surface of an object to be processed by introducing a processing gas into an airtight processing container and applying a radio frequency power to generate plasma, the method comprising steps of:

introducing a predetermined processing gas into the processing container;

applying a negative DC voltage to a first electrode provided in the processing containers, the object to be processed being placed on the first electrode, after the introducing a predetermined processing gas;

applying a bias radio frequency power to the first electrode after the negative DC voltage has been applied to the first electrode;

applying the radio frequency power for plasma generation to a second electrode that is different from the first electrode after the bias radio frequency power has been applied to the first electrode; and stopping the application of the negative DC voltage after the application of the radio frequency power for plasma generation.

10. A computer storage medium storing therein a program for controlling the plasma processing method of claim 9.

11. A method for performing a predetermined plasma process for a surface of an object to be processed by introducing a processing gas into an airtight processing container and applying a radio frequency power to an antenna to generate plasma, the method comprising the steps of:

introducing a predetermined processing gas into the processing container;

applying a negative DC voltage to an electrode provided in the processing container, the object to be processed being placed on the electrode, after the introducing a predetermined processing gas;

applying the radio frequency power for plasma generation to the antenna after the negative DC voltage has been applied to the electrode; and applying a bias radio frequency power to the electrode after the radio frequency power for plasma generation has been applied to the antenna; and stopping the application of the negative DC voltage after the application of the bias radio frequency power.

12. A computer storage medium storing therein a program for controlling the plasma processing method of claim 11.

* * * * *